United States Patent [19]

Schanen

[11] Patent Number: 5,045,805
[45] Date of Patent: Sep. 3, 1991

[54] HIGH PRECISION COMPOSITE AMPLIFIER WITH IMPROVED HIGH SPEED RESPONSE

[75] Inventor: Paul C. Schanen, Waukesha, Wis.

[73] Assignee: General Electric Company, Milwaukee, Wis.

[21] Appl. No.: 546,469

[22] Filed: Jun. 29, 1990

[51] Int. Cl.$^5$ ............................................ H03F 3/191
[52] U.S. Cl. ...................................... 330/107; 330/9; 330/109; 330/294; 330/126; 330/151
[58] Field of Search ............... 330/107, 109, 294, 126, 330/151, 9

[56] References Cited

U.S. PATENT DOCUMENTS 4,459,554  7/1987  Mattisson ............................. 330/107

OTHER PUBLICATIONS

Active Filters With Zero Amplifier Sensitivity by Geiger et al. pp. 277–288; IEEE—1979.

Harris Semiconductor Linear Products data book, 1986, pp. 10–178.
Article in Electronics Design News entitled "Composite Amplifiers Yield High Speed and Low Offset", Jim Williams; Jan. 22, 1987; pp. 4–21 and 4–22 from a 1982 Data-Acquisition Databook from Analog Devices.

Primary Examiner—Eugene R. LaRoche
Assistant Examiner—Tan Dinh
Attorney, Agent, or Firm—Quarles & Brady

[57] ABSTRACT

A high precision composite amplifier for use in a data acquisition subsystem of a Computerized Tomography (CT) scanner provides enhanced high speed response in terms of reduced settling time. The speed improvement is due to a novel compensation network in which a high frequency pole and a zero in the open loop response characteristic for the composite amplifier are forced to cancel despite component and temperature variations. The resulting amplifier exhibits a simple, higher speed, single pole response. An adjustable circuit is provided for adjusting the placement of the zero to assure optimum pole/zero cancellation.

8 Claims, 3 Drawing Sheets

HIGH PRECISION COMPOSITE AMPLIFIER WITH IMPROVED HIGH SPEED RESPONSE

BACKGROUND OF THE INVENTION

The field of the invention is high precision amplifiers for data acquisition systems and, more particularly, high precision composite amplifiers consisting of two integrated circuit operational amplifiers (op amps) connected in cascade.

High precision amplifiers are known in the art. A high precision application, as the term is used herein, is one which requires an accuracy of approximately 0.005%. It is generally known that the precision available from an amplifier is related, among other things, to the open loop gain of the amplifier. In applications where high speed is not required, single stage op amps are commercially available which provide sufficient gain. However, high speed op amps have substantially lower open loop gains, owing to tradeoffs made to achieve high speed performance. A high speed application, as the term is used herein, is an application which requires a settling time of approximately 700 nanoseconds (nS). When an application demands both high precision and high speed, it means that within the required settling time, (700 nS) the output must have settled to within the required precision (0.005%).

Because of the reduced gain of available single stage, high speed op amps, prior high speed, high precision amplifiers often comprised two high speed op amps connected in cascade. In that configuration, the net gain of the composite pair of op amps is the product of their individual gains, which is sufficient for high precision applications. However, in order to stabilize the composite configuration, a compensation network is necessary. Prior compensation networks have worked well in low speed applications, but result in degraded high speed performance, e.g. settling time, of the composite amplifier. Prior configurations of composite op amps have therefore been able to achieve the necessary precision, but have been limited in high speed performance due to delays introduced by the compensation circuits used.

SUMMARY OF THE INVENTION

A high speed, high precision composite amplifier according to the present invention includes first and second operational amplifier stages connected in cascade and a compensation network connected to the second operational amplifier. The compensation network produces a zero, a first pole, and a second pole in the open loop response for the composite amplifier. The compensation network is formed so as to make the second pole in the open loop response of the compensation network approximately equal to the zero, resulting in mutual cancellation of the zero with the second pole.

One main advantage of the present invention is improved high speed performance, i.e. reduced settling time, for a high precision composite amplifier. The pole/zero cancellation taught by this invention simplifies the open loop response for the composite amplifier to act, in effect, like the simpler, and faster, single pole response of a single stage amplifier. The result is a substantial reduction in the settling time of the composite amplifier.

In order to achieve the pole/zero cancellation taught by this invention, the second operational amplifier may include first and second external compensation connection points, and the compensation network may include a capacitor and a resistor connected in parallel between the first and second external compensation connection points. The use of external compensation is advantageous in that it affords a greater degree of control over the location of the second pole, with less sensitivity to component tolerances and temperature variation.

A main object of the invention is to provide a composite amplifier in which the location of the zero can be adjusted, or trimmed, in order to fine tune the desired cancellation of the zero with the second pole. Accordingly, the composite amplifier may include an adjustable circuit for adjusting the zero so as to force the zero to be approximately equal to the second pole. The adjustable circuit may comprise a resistive voltage divider connected between the output of the first operational amplifier and the input of the second operational amplifier, in which at least one of the resistors in the resistive voltage divider is variable.

The foregoing and other objects and advantages of the invention will appear from the following description. In the description, reference is made to the accompanying drawings which form a part hereof, and in which there is shown by way of illustration a preferred embodiment of the invention. Such embodiment does not represent the full scope of the invention, however, and reference is made therefore to the claims herein for interpreting the scope of the invention.

DESCRIPTION OF THE PREFERRRED EMBODIMENT

Figure 1:
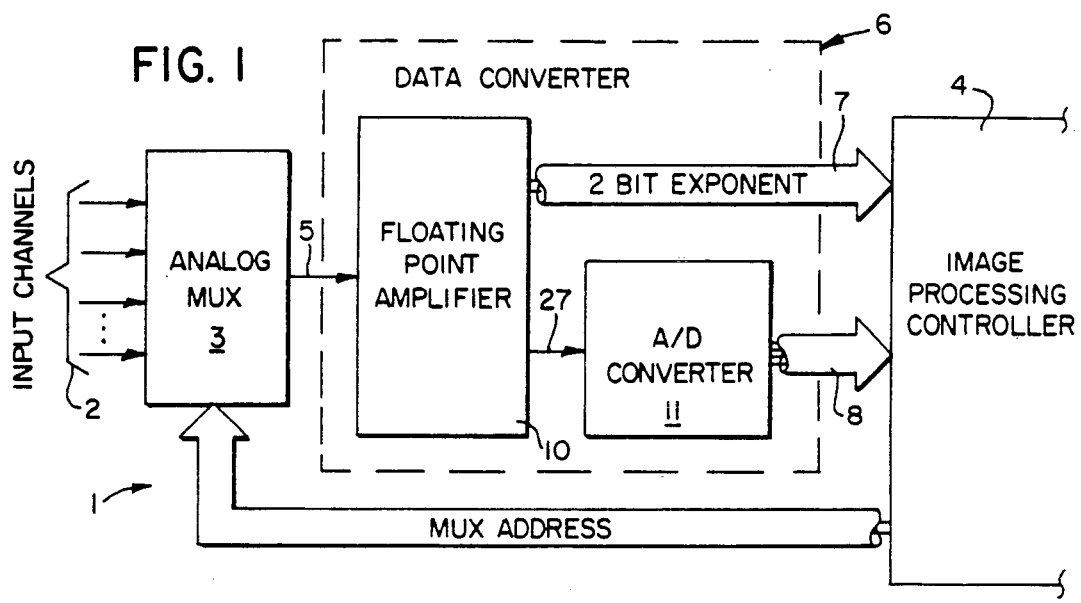
FIG. 1 is block diagram of a data acquisition subsystem for a Computerized Tomography (CT) scanner which employs a high speed, high precision composite amplifier of the present invention.

Referring to FIG. 1, a Computerized Tomography (CT) data acquisition sub-system 1 receives an analog input signal on each of a plurality of input channels 2. After input signal conditioning (not shown), the input channels 2 are connected to a multiplexer 3, which selects one input channel 2 at a time under control of an image processing controller 4. The outputs of the multiplexer 3 is an analog signal corresponding to the analog input signal on the selected input channel 2. The output 5 is connected as an input to a data converter 6. The data converter 6 translates, or converts, the analog output 5 to a floating point digital output comprising separate exponent and fractional parts, 7 and 8 respectively, as described below. The outputs 7 and 8 are then sampled by the image processing controller 4, and processed in well known fashion.

In a typical CT system, each input channel 2 is an analog signal which is itself a composite multiplexed signal from 47 different X-Ray detectors (not shown) with a total of 16 such input channels 2 in the system. Most CT system design and operational requirements dictate that all 47 detector signals on each input channel 2 must be sampled sequentially every 1 millisecond (mS), e.g. a total of 752 samples every 1 mS. Due to the speed limitation of prior amplifiers, it was necessary to utilize a total of 12 data converters 6 operating in parallel with a complex multiplexing scheme in order to acquire all of the samples in the required time.

Conversely, using the high speed amplifiers of this invention, only two data converters 6 are needed to acquire the same number of samples within the 1 mS period. One such data converter 6 is shown in FIG. 1 configured to service eight of the sixteen input channels 2. Is is understood that a second data converter (not shown) services the other eight channels. Thus a substantial savings in hardware complexity and cost is made possible by the high speed amplifiers of this invention.

Still referring to FIG. 1, the data converter 6 is comprised of two primary elements: a floating point amplifier (FPA) 10, and a conventional analog to digital (A/D) converter 11. The floating point amplifier 10 serves as a prescaler, applying discrete amplification factors to the input 5 to bring it within the optimum range for conversion by the A/D converter 11. The amplification factors, or "gain" of the floating point amplifier 10 are typically powers of two, with the factors used in this embodiment being 1, 8, and 64. The selected amplification factor is encoded by the FPA 10 as a two bit exponent 7 of a digital floating point number. The output 8 of the A/D converter 11 then represents a fractional part of the digital floating point number. The digital floating point number comprised of the exponent 7 and the fractional part 8 is input into the image processing controller 4 for further processing.

Figure 2:
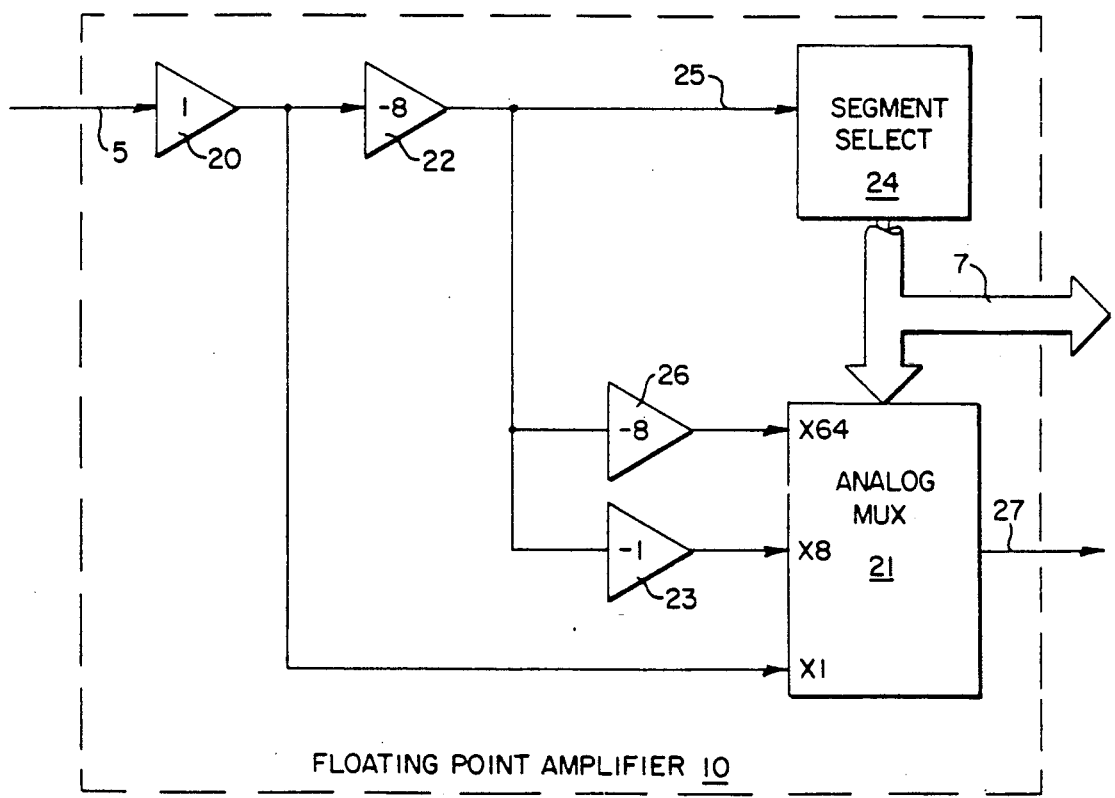
FIG. 2 is a block diagram of a floating point amplifier which forms a part of the data acquisition subsystem of FIG. 1.

Referring to FIG. 2, the input 5 to the floating point amplifier 10 is first buffered by a unity gain amplifier 20. The output of amplifier 20 is applied to one input of an analog multiplexer 21 as an "X1" input. The output of amplifier 20 is also connected to the input of inverting amplifier 22, which provides a gain of −8. The output of amplifier 22 is connected to the inputs of inverting amplifiers 23 and 26, with respective gains of −1 and −8. The output of amplifier 26 therefore represents a net amplification of +64 (−8 * −8) of the original input signal 5, and is connected as an "X64" input of analog multiplexer 21. Similarly, the output of amplifier 23 is connected as an "X8" input (−* −1 X +8) of analog multiplexer 21. The output of amplifier 22 is also connected as an input 25 to a segment select circuit 24.

Figure 3:
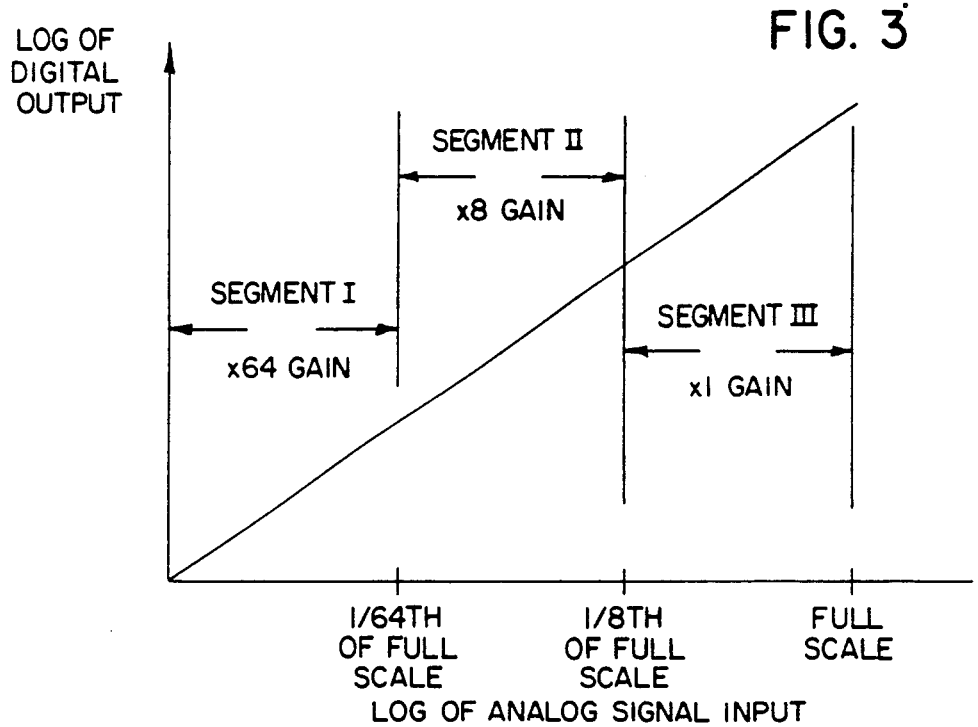
FIG. 3 is a graph of the net transfer function for a data converter which forms a part of the data acquisition subsystem of FIG. 1.

Referring to FIGS. 2 and 3, in order to increase the range of inputs accepted by the data converter 6, the input 5 is conceptually sub-divided into three segments, numbered I-III. The segment select circuit 24 operates in well known fashion to select the proper amount of gain, ×64, ×8, or ×1, corresponding to the segments I-III, respectively. The segment select circuit 24 compares the input 25 to thresholds corresponding to (1) a full scale value for the analog input of the A/D converter 11, and (2) one eighth of that full scale value. Since the input 25 to the segment select circuit 24 has already been amplified by a factor of 8, the thresholds used actually correspond to values of the original input signal 5 of 1/64 and ⅛ of full scale, respectively.

Based on the threshold comparisons, the segment select circuit 24 encodes two binary control lines which comprise the exponent 7. The exponent 7 is connected both as a control input to the analog multiplexer 21 and as the 2 bit exponent to the image processing controller 4. The analog multiplexer 21 thereby selects the output of one of the amplifiers 20, 23, or 26 having the magnitude of amplification, ×1, ×8, or ×64, respectively, according to the segment in which the input signal 5 resides. This ensures that output 27 of analog multiplexer 21 is as large as possible without exceeding the full scale input to the A/D converter 11.

Because of the large numbers of channels to be converted by the data converter 6, the relative conversion rate can be L quite high. A conversion rate of 2.33 microseconds ($\mu S$) per sample is preferred in this embodiment. The A/D converter 11 is of the sample and hold type, with the preferred sampling period 2.33 $\mu S$. Upon changing the input channel 2 selected by the input multiplexer 3, the signal on the newly selected channel 2 must propagate through the input multiplexer 3, through the floating point amplifier 10, and become stable at the input of the A/D converter 11 somewhat before the 2.33 $\mu S$ period expires. This requires that the amplifiers 20, 22, 23 and 26 in the floating point amplifier 10 must have a wide frequency bandwidth and extremely short settling time, since any path through the floating point amplifier 10 requires propagation through a combination of two or three of the amplifiers 20, 22, 23 and 26 in series. The preferred settling time is on the order of 700 nS per amplifier, or as great as 3 * 700 nS = 2.1 $\mu S$ for three amplifiers connected in series.

The graph of FIG. 3 represents the net transfer function for the data converter 6. Ideally, the three segments I-III would be perfectly aligned and continuous. There are two factors which affect this alignment, specifically the slope and the zero intercept, or offset, of each of the segments. The offset of each segment can be corrected by known autozero circuits or, preferably, by an improved digital autozero circuit described in a co-pending U. S. Patent Application filed on the same date as this application and entitled IMPROVED AUTOZEROING APPARATUS AND METHOD FOR A COMPUTERIZED TOMOGRAPHY DATA ACQUISITION SYSTEM.

The slope of each segment represents the net gain of the 20 amplification applied in that segment. It is therefore necessary to insure that the gain of each amplifier 20, 22, 23 and 26 is accurate to a level commensurate with the desired precision. In this embodiment, that desired precision is 0.005%. Single stage operational amplifiers are available capable of providing the required speed and accuracy at unity gain. Such single stage op amps are employed, for example, in amplifiers 20 and 23.

However, when a significant amount of gain is also required, as in amplifiers 22 and 26, single stage op amps are limited both in precision and speed, as explained in detail below. Composite amplifiers comprising two op amps connected in cascade have been successfully used to provide the necessary accuracy, but such amplifiers also introduce unacceptably long settling times. Those long settling times are in turn a limiting factor in the maximum sampling rate attainable. This invention provides an amplifier with both the required gain, precision and an extremely fast settling time, which allows increased sampling rates.

Figure 4:
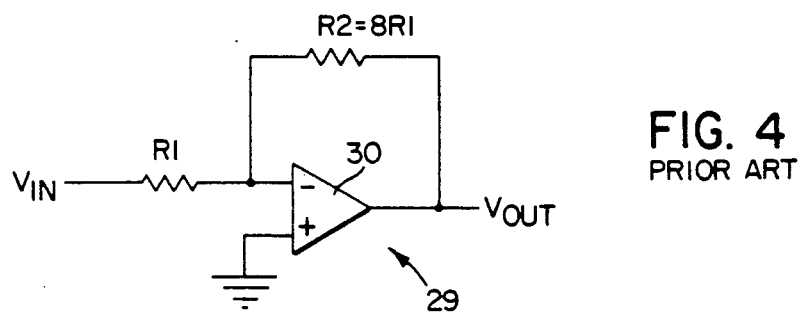
FIG. 4 is a schematic diagram of a prior art inverting amplifier.

Referring to FIG. 4, the gain of an elementary inverting closed loop amplifier 29 is approximated by the expression:

$$\text{GAIN} = \frac{V_{out}}{V_{in}} = -\left[\frac{R2}{R1}\right] \quad (1)$$

For example, a gain of $-8$ is attained when $R2 \times 8 * R1$. The ratio of resistors R1 and R2 can be obtained in the required precision as commercially available precision matched resistor pairs. However, the approximation given by equation 1 is not exact. The exact gain expression is given by:

$$\text{GAIN} = \frac{V_{out}}{V_{in}} = -\left[\frac{A\left(\frac{R2}{(R1+R2)}\right)}{A\left(\frac{R1}{(R1+R2)}\right)+1}\right] \quad (2)$$

Where: "$A$" is the open loop D.C. gain of the amplifier 30.

This latter gain expression (2) can only be reduced to the much simpler former expression (1) in the case where the term $$A * \left(\frac{R1}{(R1+R2)}\right)$$

is much greater than 1. The degree to which the approximation is true will determine the accuracy of the simple gain expression (1). To attain the desired accuracy of 0.005% for a "gain-of-8" amplifier (e.g. $R2 = 8 * R1$), the value of "A" in the equation (2) would have to be greater than 180,000 volts/volt. Note that for a "gain of 1" amplifier, where $R1 = R2$, the value of "A" need only be on the order of 40,000 volts/volt to achieve the same accuracy.

Commercially available high speed op amps are limited to open loop gains suitable for unity closed loop gain applications ($A \approx 40,000$), but not for higher closed loop amplification factors. For example, in a "gain-of-8" amplifier as in the present embodiment, an open loop gain "A" of $>180,000$ is required, but is not commercially available in a high speed, single stage op amp. The limitation in open loop gain in high speed, single stage op amps is due to design trade-offs made to achieve high speed performance.

One possible solution to this inadequate open loop gain situation is to adjust R1 or R2 at the time of manufacture to compensate. This approach is unacceptable, as the open loop gain of the amplifier is very prone to drift with temperature and time.

Figure 5:
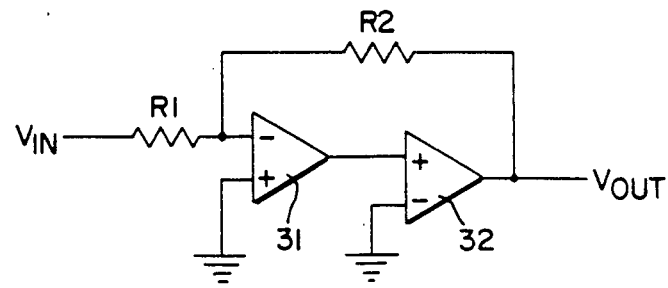
FIG. 5 is a schematic diagram of a prior art, uncompensated composite amplifier.

Another potential solution is to increase the open loop gain of the amplifier. This can be accomplished, as is known in the art, by connecting two op amp stages 31 and 32 in cascade, as shown in FIG. 5. In that case, the open loop gain of the cascade pair is equal to the product of the individual stage open loop gains. However, the basic cascade connection of FIG. 5 is not a practical solution, as it is uncompensated and will oscillate.

Figure 6:
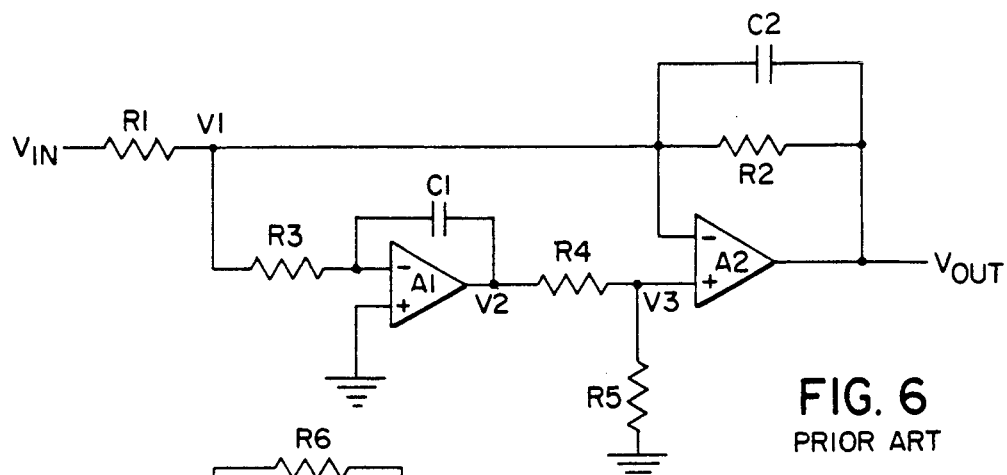
FIG. 6 is a schematic diagram for a prior art, compensated composite amplifier.

A compensated version of a cascade op amp connection, as shown in FIG. 6, has commonly been used for prior high precision amplifiers. The amplifier configuration of FIG. 6 has sufficient open loop D.C. gain to achieve the required precision, but because of the compensation network used, also introduces an unacceptably long settling time. This makes the amplifier configuration of FIG. 6 unacceptable for high speed applications, since it would be required to "wait" a relatively long time for the amplifier output to settle to the desired accuracy.

The source of the poor high speed performance inherent in the amplifier configuration of FIG. 6, and the improved high speed performance provided by this invention can now be described. The open loop frequency response, in terms of the complex frequency operator "S", typical of commonly available single stage op amps is given by the following simple single pole expression:

$$\bar{A}(S) = \frac{A}{T_1 S + 1} \quad (3)$$

Where:
$T_1$ is a characteristic time constant determined by the construction and internal compensation of the single stage op amp.

The above expression is generally valid except for some high frequency poles, which generally do not greatly affect the dynamic response of the closed loop amplifier. It can be shown mathematically by first substituting the expression for "A(S)" in Equation (3) for the value of "A" in Equation (2) and then taking the inverse Laplace Transform, that the time domain response to a unit step input for the single stage amplifier configuration of FIG. 4 is given by the expression:

$$V_{out}(t) = -\left[\frac{R2}{R1}\right] V_{in} [1 - e^{-t/T_2}] \quad (4)$$

Where: $T_2 \approx \frac{T_1 [R1 + R2]}{A \, R1}$

In other words, the unit step response is a simple first order or single time constant response. The time constant $T_2$ is approximately equal to the product of the non-inverting gain $$\left(\frac{[R1 + R2]}{R1}\right)$$

and the inverse of the open loop unit gain frequency $$\left(\frac{T_1}{A}\right),$$

expressed in radians.

For example, the time needed for a single stage amplifier to settle within 0.005% of the final value ($e - t/T2 < 5*10^{-5}$) is approximately ten times the time constant $T_2$. Therefore, in order to reach that settling accuracy in the requisite 700 nS, the time constant $T_2$ needs to be about 70 nS. For a "gain-of-8" amplifier, an open loop unit gain frequency of 125 megaradians/sec, or approximately 20 megahertz would be needed to achieve the 70 nS value for $T_2$. Unfortunately, as previously noted, commercially available single stage operational amplifiers having that high of a frequency response have substantially lower open loop D.C. gains, too low to achieve the desired absolute accuracy.

Conversely, the open loop frequency response for the composite amplifier of FIG. 6 is a second order expression of the following form:

$$G(S) = \frac{A1\ A2\ (1\ +\ T_4 S)}{(1\ +\ T_3 S)(1\ +\ T_5 S)} \quad (5)$$

Where:
$A1$ and $A2$ are the respective open loop gains for the cascade op amps in the composite amplifier.

As in the previous first order open loop response case, it can be shown mathematically that the closed loop unit step response will have the form of the classic second order response as follows:

$$V_{out}(t) = Be^{-t/T_6} + Ce^{-t/T_7} \quad (6)$$

Furthermore, it can be shown that both $T_6$ and $T_7$ will always be greater than $T_2$ of Equation (4). Even worse, the larger value of either $T_6$ or $T_7$ can be many times greater than the smaller value. Admittedly, the corresponding coefficient for the larger value of $T_6$ or $T_7$, e.g. "B" or "C", respectively, will be quite small. However, it will nevertheless generally prevent reaching a settling accuracy of 0.005% within a high speed settling time of approximately 700 nS.

This invention provides a reliable and stable means of controlling $T_4$ and $T_5$ in Equation (5) so that they are equal, leaving the simple form first order expression of Equation (3). A schematic diagram f the improved circuit is shown in FIG. 7.

To understand how this circuit provides the necessary pole/zero cancellation, it is first necessary to understand where each one of the poles and the zero in Equation (5) are generated in terms of the various circuit elements. A first pole associated with $T_3$ is a low frequency pole generated at the highest frequency that the gain of the integrator formed by $R_3$, $C_1$ and $A_3$ is equal to the D.C. open loop gain of amplifier $A_3$. A zero associated with $T_4$ occurs at the frequency that the circuit gain from points V1 to V3 reaches unity gain. A second pole associated with $T_5$ is a high frequency pole established by the open loop gain of op amp A4. It is the latter, or second pole, determined by $T_5$ which is usually not well regulated and thus does not exactly cancel the zero associated with $T_4$. This lack of cancellation is the cause of the poor settling performance indicated above.

Figure 7:
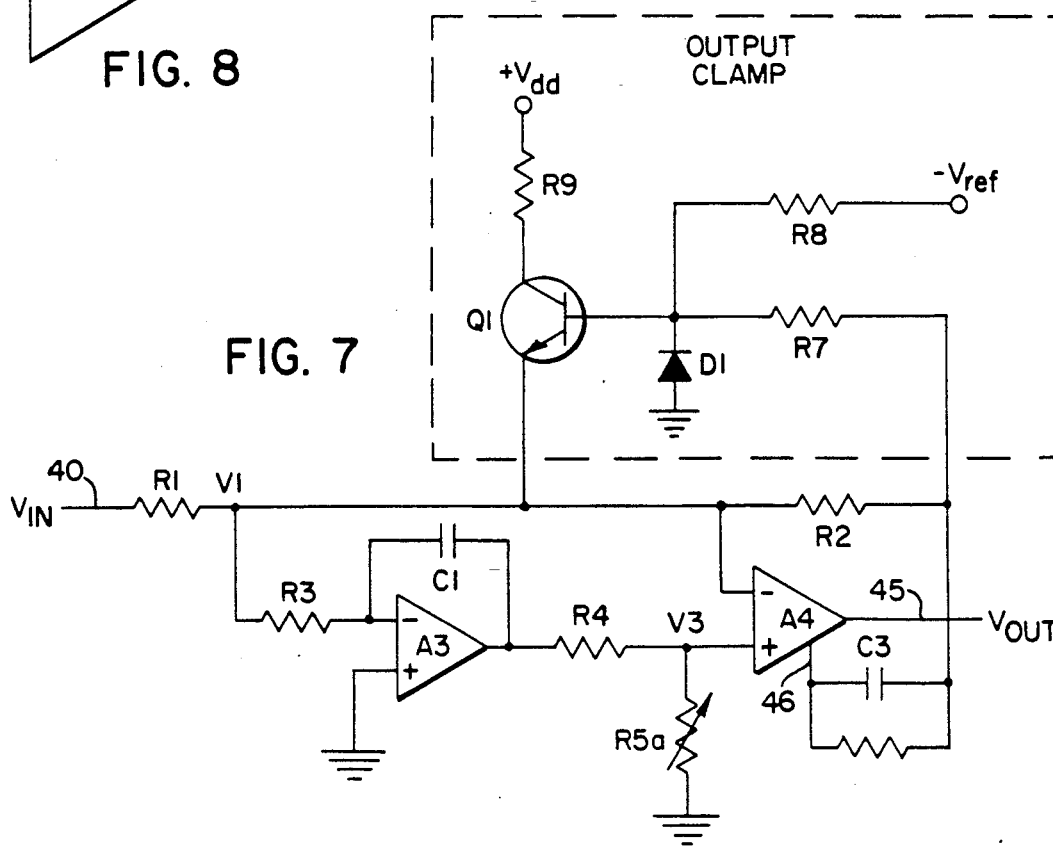
FIG. 7 is a schematic diagram for an inverting gain of eight composite amplifier which forms a part of the floating point amplifier of FIG. 2.

The amplifier circuit of FIG. 7 differs from prior cascade amplifier circuits in that the second amplifier, A4, is an externally compensated op amp. By using external compensation, a much greater degree of control over $T_5$ is realized. The external compensation is provided by capacitor C3 and resistor R6 connected in parallel between a pair of external compensation connection points, specifically an output 45 and an external compensation input 46 of amplifier A4. Connecting R6 in parallel with C3 is a unique aspect of this invention which departs from the normal practice of using C3 alone or C3 in series with a resistor. As discussed below, a resistor in parallel with C3 sacrifices some gain, but provides the control necessary to achieve the desired pole/zero cancellation.

Figure 8:
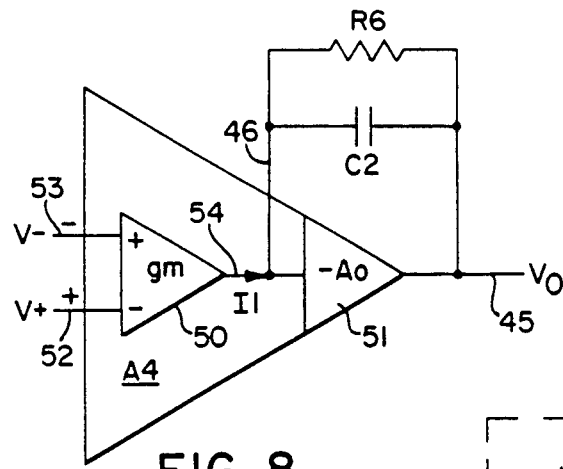
FIG. 8 is a schematic diagram for an op amp with external compensation which forms a part of the amplifier of FIG. 7.

Referring to FIG. 8, it can now be shown how the compensation provided by this invention achieves the necessary pole/zero cancellation. Operational amplifier A4, as is typical of almost all modern op amps, is composed of two stages 50 and 51. The input stage 51 is commonly referred to as the differential stage. This differential stage 51 converts the differential input voltage between the + and −inputs 52 and 53, respectively, into a single ended current I1 at the output 54 of differential stage 51. The transfer function for the differential stage 51 is defined by a single transconductance value gm, such that:

$$I1 \times (V+ - V-)\ gm \quad (7)$$

The second, or output, stage 51 serves to convert the single ended current input I1 into a single ended voltage output $V_0$, providing an inverting gain of $-A_o$. Ignoring the effect of R6, the D.C. transfer function of the output stage 51 is:

$$V_0 \times -A_o\ I1 \quad (8)$$

Likewise, the A.C. transfer function of the output stage 51 is defined by:

$$V_o = -\left[\frac{I1}{S\ C3}\right] \quad (9)$$

Extending the above equations to the total operational amplifier A4, still ignoring R6, we get the following D.C. and A.C. transfer functions:

$$\text{D.C. Gain} \times -Ao\ gm \quad (10)$$

$$\text{A.C. Gain} = \frac{-gm}{S\ C3} \quad (11)$$

The A.C. equation (11) applies for high frequencies, where its value is greater than the corresponding D.C. expression (10). In other words, the frequency corresponding to $T_5$ in equation (5) equals the frequency at which the values of the above D.C. and A.C. equations, (10) and (11) respectively, are equal. Unfortunately, that frequency varies as a function of $A_o$ and gm, and thus tends to be relatively unstable. This instability prevents assured pole/zero cancellation in equation (5).

With the addition of R6, however, we obtain a new transfer function for A4:

$$A4(S) = \frac{-gm\ R6}{(R6\ C3\ S) + 1} \quad (12)$$

This expression (12) indicates that some of the D.C. open loop gain for the amplifier has been sacrificed in order to obtain a fixed frequency pole, as determined by R6 and C3. The loss of D.C. open loop gain is not a serious loss because the total D.C. open loop gain is still quite large, as explained in greater detail below.

Referring again to FIG. 7, resistors R4 and R5a are connected in a voltage divider configuration between the output of op amp A3 and the input of op amp A4. The resultant attenuation does not significantly affect the overall accuracy of the amplifier because the open loop gain of the cascaded op amp pair is so large to begin with. In particular, the op amps preferred in this embodiment are type OPA-111, available from Burr Brown, Addison, IL. for op amp A3, and type AD380, available from Analog Devices, Norwood, MA for op amp A4. The OPA-111 has an open loop gain of 500,000 volts/volt, while the AD380 has an open loop gain of 25,000 volts/volt, yielding an A3*A4 product of 125*1010. As stated above, approximately 180,000 volts/volt is sufficient to achieve the desired accuracy of 0.005%, so that the attenuations caused by the C3, R6 compensation network and the R4, R5a voltage divider are negligible. It should also be noted that op amp A3 is a high gain type, having an open loop D.C. gain which by itself exceeds the 180,000 volts/volt gain requirement. However, in the cascade configuration, op amp A3 functions as an offset error integrator, and therefore does not require a frequency response as high as that required for op amp A4. This permits a lower speed, high gain op amp to be used for A3.

The beneficial effects of the resistive voltage divider formed by resistors R4 and R5a are two fold. First and most importantly, any practical realization of the circuit of FIG. 7 will introduce stray capacitances into the circuit, particularly affecting the C3, R6 compensation network. Those effects, along with the manufacturing tolerances associated with real components, may prevent the exact pole/zero cancellation which is desired. It is an important discovery of this invention that by making R5a adjustable, it is possible to nullify to a maximum extent the imperfections of the actual circuit, thereby optimizing the pole/zero cancellation.

The procedure for adjusting R5a is as follows. A square wave signal generator (not shown) having a very fast, e.g. square, rise time is connected to the input 40 of the amplifier of FIG. 7. The output 45 is then monitored on an oscilloscope (not shown), also having sufficient bandwidth to display fast rise time signals. Resistor R5a is adjusted for optimum response to the square wave input, e.g. best rise time without overshoot. Attenuations produced by the R4/R5a network which provide optimum settling time have been determined experimentally to be between approximately 0.2 and 0.25 for the components used in this embodiment. Preferably, the range of adjustment for R5a is made to provide attenuations throughout the stated range and somewhat beyond.

The second benefit of the voltage divider formed by resistors R4 and R5a is that it provides attenuation of noise produced by op amp A3. During near zero input signal conditions, noise produced by A3 due to imperfections in that device would otherwise be amplified directly by cascaded op amp A4. The attenuation provided by the R4, R5a network acts to reduce that noise and thereby improve the signal to noise ratio of the cascaded pair during low level input conditions.

As for the remaining components in the amplifier of FIG. 7, the ratio of resistors R1 and R2 sets the gain of the amplifier. As such, resistor R1 and R2 are a precision matched pair, as is known in the art, laser trimmed to match their ratio to within 0.005%. The ratio of R2 to R1 is 8.0000 to 1.0000 for the "gain of 8" amplifiers 22 and 26 of FIG. 2. The network of R3, C1 and op amp A3 produces the first, or low frequency pole which provides the necessary compensation for stable operation, as with prior composite amplifiers.

Finally, a practical implementation of the amplifier of FIG. 7 will saturate if the output signal becomes too great. This condition is undesirable, as substantial additional time would be required to come out of saturation.

To prevent the amplifier from saturating, it is preferred to include an output clamp 50, as is known in the art. The output clamp 50 acts to prevent Vout from reaching the positive saturation voltage of amplifier A4. The saturation of A4 would cause A3 to operate out of its normally very limited operating range (i.e. with both input and output very near to zero volts). Since the integrating amplifier formed by op amp A3, R3 and C1 is relatively slow, the composite amplifier would take a long time to recover after the overdrive input was removed. The particular clamp shown in FIG.7 is adapted for unipolar, positive output voltages. By analogy, a similar but negative voltage clamp could be added in parallel for bi-polar operation.

I claim:

1. In a high precision composite amplifier which includes first and second operational amplifier stages connected in cascade and a compensation network which produces a pole/zero open loop frequency response for the composite amplifier having a zero at a first frequency, a first pole at a second frequency, and a second pole at a third frequency, the improvement wherein the compensation network is formed from a net of compensation components, with the set of compensation components having component values which result in the third frequency for the second pole being approximately equal to the first frequency for the zero, thereby resulting in mutual cancellation of the zero with the second pole and reducing the settling time of the composite amplifier.

2. The improvement of claim 1 in which the second operational amplifier includes first and second external compensation connection points, and the set of compensation components includes a capacitor and a resistor connected in parallel between the first and second external compensation connection points.

3. The improvement of claim 1 in which the set of compensation components includes an adjustable circuit for adjusting the first frequency of the zero so as to force the third frequency of the second pole to be approximately equal to the first frequency of the zero.

4. The improvement of claim 3 in which the adjustable circuit comprises a resistive voltage divider connected between an output of the first operational amplifier and an input of the second operational amplifier, and in which at least one resistor in the resistive voltage divider is variable.

5. A high speed, high precision composite amplifier comprising:
   first and second operational amplifier stages connected in cascade;
   a compensation network connected to the first and second operational amplifiers which produces a pole/zero open loop frequency response for the composite amplifier having a zero at a first frequency, a first pole at a second frequency, and a second pole at a third frequency, the compensation network being formed from a set of compensation components, with the set of compensation components having component values which result in the third frequency for the second pole being approximately equal to the first frequency for the zero, thereby resulting in mutual cancellation of the zero with the second pole and reducing the settling time of the composite amplifier.

6. The amplifier of claim 5 in which the second operational amplifier includes first and second external compensation connection points, and the set of compensation components includes a capacitor and a resistor connected in parallel between the first and second external compensation connection points.

7. The amplifier of claim 6 in which the set of compensation components includes an adjustable circuit for adjusting the first frequency of the zero so as to force the third frequency of the second pole to be approximately equal to the first frequency of the zero.

8. The amplifier of claim 7 in which the adjustable circuit comprises a resistive voltage divider connected between an output of the first operational amplifier and an input of the second operational amplifier, and in which at least one resistor in the resistive voltage divider is variable.

* * * * *

UNITED STATES PATENT AND TRADEMARK OFFICE
CERTIFICATE OF CORRECTION

PATENT NO.  : 5,045,805
DATED       : September 3, 1991
INVENTOR(S) : Paul C. Schanen It is certified that error appears in the above-identified patent and that said Letters Patent is hereby corrected as shown below:

At Column 3, Line 55, change "(-* -1 X +8)" to --(-8 * -1 = +8)--.

At Column 4, Line 18, change "be L quite" to --be quite--.

At Column 5, Line 11, change "X" to --=--.

At Column 8, Line 15, change "X" to --=--.

At Column 8, Line 35, change "X" to --=--.

At Column 10, Line 23, Claim 1, change "net" to --set--.

Signed and Sealed this

Twelfth Day of January, 1993

Attest:

DOUGLAS B. COMER

*Attesting Officer*    *Acting Commissioner of Patents and Trademarks*